US008971116B1

(12) United States Patent
Lim

(10) Patent No.: US 8,971,116 B1
(45) Date of Patent: Mar. 3, 2015

(54) SEMICONDUCTOR DEVICE AND METHOD OF OPERATING THE SAME

(71) Applicant: SK Hynix Inc., Gyeonggi-do (KR)

(72) Inventor: Sang Oh Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/103,428

(22) Filed: Dec. 11, 2013

(30) Foreign Application Priority Data

Oct. 7, 2013 (KR) .................. 10-2013-0119357

(51) Int. Cl.
*G11C 16/00* (2006.01)
*G11C 16/28* (2006.01)
*G11C 16/34* (2006.01)

(52) U.S. Cl.
CPC ............ *G11C 16/28* (2013.01); *G11C 16/3436* (2013.01)
USPC ............ 365/185.12; 365/185.22; 365/189.05; 365/200

(58) Field of Classification Search
CPC .. G11C 16/28; G11C 16/344; G11C 16/3436; G11C 16/3445; G11C 16/3454; G11C 16/3459
USPC ........... 365/185.12, 185.22, 189.05, 200, 201
See application file for complete search history.

(56) References Cited

U.S. PATENT DOCUMENTS

| 5,903,497 | A | * | 5/1999 | Yu et al. | .................. | 365/185.22 |
| 5,936,890 | A | * | 8/1999 | Yeom | ....................... | 365/185.22 |
| 7,545,692 | B2 | * | 6/2009 | Jang | .............................. | 365/201 |
| 8,289,769 | B2 | * | 10/2012 | Lim | ........................ | 365/185.03 |
| 8,570,801 | B2 | * | 10/2013 | Lim et al. | ................ | 365/185.03 |
| 8,767,481 | B2 | * | 7/2014 | Cho et al. | ................ | 365/189.05 |

FOREIGN PATENT DOCUMENTS

KR  100994713  11/2010

* cited by examiner

*Primary Examiner* — Tan T. Nguyen
(74) *Attorney, Agent, or Firm* — IP & T Group LLP

(57) ABSTRACT

A semiconductor device includes a plurality of page buffers coupled to bit lines and suitable for performing a verification operation to output a verification signal to a verification terminal, wherein a predetermined number of page buffers are grouped into a sub-page buffer group; and verification signal control units, wherein each of the verification signal control units is coupled to the page buffers included in the corresponding sub-page buffer group and suitable for controlling to output the verification signals from the page buffers included in the corresponding sub-page buffer group to a verification terminal based on fail column data.

12 Claims, 7 Drawing Sheets

SEMICONDUCTOR DEVICE AND METHOD OF OPERATING THE SAME

CROSS-REFERENCE TO RELATED APPLICATION

The present application claims priority to Korean patent application number 10-2013-0119357 filed on Oct. 7, 2013, in the Korean Intellectual Property Office, the entire disclosure of which is incorporated by reference herein.

BACKGROUND

1. Technical Field

Various embodiments of the present invention relate to a semiconductor device and a method of operating the same.

2. Related Art

Semiconductor memory devices may be largely classified as either volatile memory devices or non-volatile memory devices.

The volatile memory device may perform a read/write operation at a high speed, and may lose stored data when a power supply is blocked. Meanwhile, the non-volatile memory device has a low write and read speed compared to the volatile memory device in the read/write operation, but may retain the stored data even when not powered. Accordingly, the non-volatile memory device is used to store data to be maintained regardless of the power supply. The non-volatile memory device includes a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and the like. Flash memories may be classified a NOR-type and a NAND-type.

Flash memories have an advantage of a RAM in that programming and erasure of cell data are free, and an advantage of the ROM in that stored data is maintained even when not powered. The flash memories are widely used as a storage medium of portable electronic devices such as a digital camera, a personal digital assistant (PDA), an MP3 player, and the like.

It is required for the semiconductor devices to have high data reliability.

BRIEF SUMMARY

Various embodiments of the present invention are directed to a semiconductor device having high data reliability, and a method of operating the same.

One aspect of the present invention provides a semiconductor device including: a plurality of page buffers coupled to bit lines and suitable for performing a verification operation to output a verification signal to a verification terminal, wherein a predetermined number of page buffers are grouped into a sub-page buffer group; and verification signal control units, wherein each of the verification signal control units is coupled to the page buffers included in the corresponding sub-page buffer group and suitable for controlling to output the verification signals from the page buffers included in the corresponding sub-page buffer group to a verification terminal based on fail column data.

Each of the verification signal control units may include: a third latch unit suitable for latching the fail column data; and a voltage control unit connected to the verification unit, and suitable for controlling to allow a voltage to be input to the verification unit based on the fail column data.

Another aspect of the present invention provides a method of operating a semiconductor device, including: performing a verification operation on a memory cell; and outputting a verification signal to a verification terminal based on verification result data generated in the performing of the verification operation, wherein the verification signal is prevented from being output to the verification terminal when the memory cell is included in a fail column.

When the memory cell is included in the fail column, the method may further include blocking the generation of the verification result data after the performing of the verification operation.

Another aspect of the present invention provides a semiconductor device, including: a memory array including a plurality of row lines and a plurality of column lines; a plurality of page buffers coupled to the respective column lines and suitable for performing a verification operation to output a verification signal to a verification terminal, wherein each of the page buffers includes a first latch unit for generating verification result data obtained by the verification operation, a second latch unit for controlling the generation of the verification result data based on fail column data, and a verification unit for generating the verification signal based on the verification result data; a verification signal control unit coupled to the predetermined number of page buffers and suitable for controlling to output the verification signal from the predetermined number of page buffers to a verification terminal based on the fail column data, wherein the verification signal control unit includes a third latch unit suitable for latching the fail column data, and a voltage control unit coupled to the verification unit and suitable for controlling to allow a voltage to be input to the verification unit based on the fail column data; and a pass/fail check circuit coupled to the verification terminal and suitable for generating a verification pass/fail signal based on the verification signal.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

Figure 1:
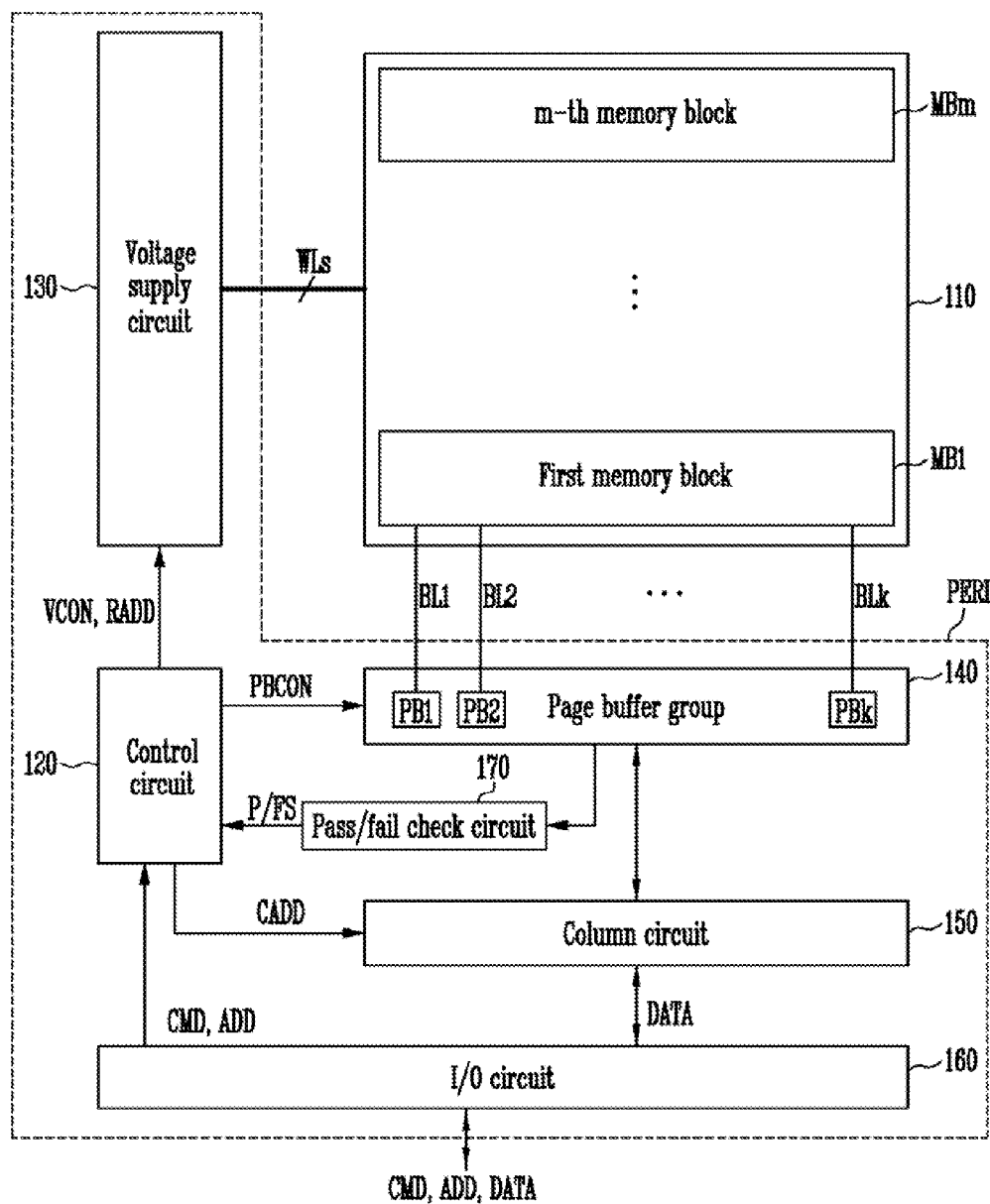
FIG. 1 is a block diagram illustrating a semiconductor device according to an exemplary embodiment of the present invention.

Advantages and features of the present invention, and methods of achieving the same will be described more fully hereinafter with reference to the accompanying drawings, in which exemplary embodiments of the invention are shown. This invention may, however, be embodied in different forms and should not be construed as limited to the embodiments set forth herein. The embodiments of the present invention are provided for describing in detail to be easily implemented by those of ordinary skill in the art, and the spirit and scope of the present invention should be understood by claims of the present invention. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
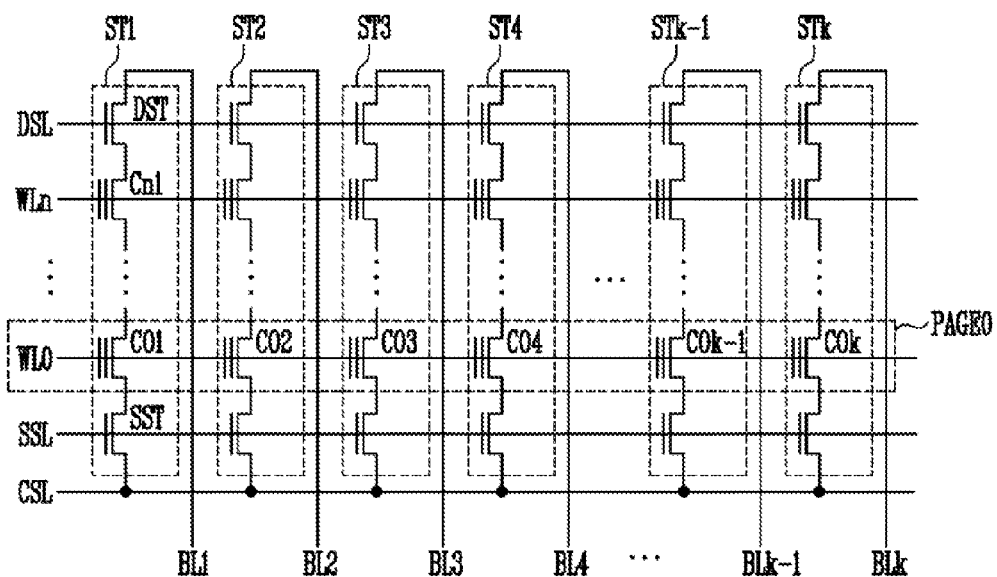
FIG. 2 is a detailed diagram illustrating a memory block shown in FIG. 1.

FIG. 1 is a block diagram illustrating a semiconductor device according to an embodiment of the present invention. FIG. 2 is a detailed diagram of a memory block shown in FIG. 1.

Referring to FIG. 1, the semiconductor device according to an embodiment of the present invention may include a memory array 110 including first to m-th memory blocks MB1 to MBm, and a peripheral circuit PERI for performing program, erase, and verification operations on memory cells included in a selected page of the memory blocks MB1 to MBm. The peripheral circuit PERI may include a control circuit 120, a voltage supply circuit 130, a page buffer group 140, a column circuit 150, an I/O circuit 160, and a pass/fail check circuit 170.

Referring to FIG. 2, each of the memory blocks MB1 to MBm may include a plurality of strings ST1 to STk connected between bit lines (or column lines) BL1 to BLk and a common source line CSL. That is, the strings ST1 to STk are connected to the corresponding bit lines BL1 to BLk, respectively, and are commonly connected to the common source line CSL. The string ST1 includes a source select transistor SST having a source connected to the common source line CSL, a plurality of memory cells C01 to Cn1, and a drain select transistor DST having a drain connected to the bit line BL1. The memory cells C01 to Cn1 are connected in series between the source select transistor SST and the drain select transistor DST. A gate of the source select transistor SST is connected to a source select line SSL, gates of the memory cells C01 to Cn1 are connected to word lines WL0 to WLn, respectively, and a gate of the drain select transistor DST is connected to a drain select line DSL.

The memory cells included in each of the memory blocks MB1 to MBm are divided in units of physical pages or logical pages. For example, the memory cells C01 to C0k connected to one word line (e.g., WL0) constitute one physical page PAGE0. The page may be a basic unit of a program or verification operation.

The control circuit 120 outputs a voltage control signal VCON for generating a voltage required for a program, erase, or verification operation in response to a command signal CMD input through the I/O circuit 160 from the outside, and outputs a page buffer control signal PBCON for controlling page buffers PB1 to PBk included in the page buffer group 140 depending on a type of the operation. An operation that the control circuit 120 controls the page buffer group 140 will be described hereinafter. Further, the control circuit 120 outputs a row address signal RADD and a column address signal CADD in response to an address signal ADD input through the I/O circuit 160 from the outside.

The voltage supply circuit 130 provides operating voltages needed for the program, erase, and verification operations for memory cells in response to the voltage control signal VCON of the control circuit 120 to local lines including a drain select line DSL, word lines WL0 to WLn, and a source select line SSL of a selected memory block. The voltage supply circuit 130 may include a voltage generation circuit and a row decoder.

The voltage generation circuit outputs the operating voltages needed for the program, erase, and verification operations of the memory cells to global lines in response to the voltage control signal VCON of the control circuit 120. For example, the voltage generation circuit outputs a program voltage to be applied to memory cells of a selected page and a pass voltage to be applied to memory cells of a non-selected page to the global lines, in order to perform the program operation. The voltage generation circuit outputs a verification voltage to be applied to memory cells of a selected page and a pass voltage to be applied to memory cells of a non-selected page to the global lines, to perform the verification operation. The voltage generation circuit outputs an erase voltage to be applied to memory cells of a selected memory block to the global lines, in order to perform the erase operation.

The row decoder connects the global lines and the local lines DSL, WL0 to WLn, and SSL so that the operating voltages output from the voltage generation circuit to the global lines are transferred to the local lines DSL, WL0 to WLn, and SSL of a selected memory block in the memory array 110 in response to the row address signal RADD output from the control circuit 120. Accordingly, the program or verification voltage is applied to the local word line (e.g., WL0) connected to a selected cell (e.g., C01) from the voltage generation circuit through the global word line. Further, the pass voltage is applied to the local word lines (e.g., WL1 to WLn) connected to non-selected cells (e.g., C11 to Cn1) from the voltage generation circuit through the global word lines. The erase voltage may be applied to all memory cells of a selected memory block in the erase operation. Accordingly, data is stored in the selected memory cell C01 by the program voltage, or it is verified by the verification voltage whether the data is stored in the selected memory cell C01.

The page buffer group 140 may Include a plurality of page buffers PB1 to PBk connected to the memory array 110 through the bit lines BL1 to BLk. The page buffers PB1 to PBk of the page buffer group 140 precharge the bit lines BL1 to BLk in order to perform the program verification operation on the memory cells C01 to C0k in response to the page buffer control signal PBCON output from the control circuit 120, or sense voltage changes of the bit lines BL1 to BLk. The page buffer group 140 precharges all the selected bit lines in the program verification operation. Further, when the verification voltage is applied from the voltage supply circuit 130 to a selected word line WL0, the bit lines of the memory cells on which the program operation is completed are maintained in a precharge state, and the bit lines of the memory cells on which the program operation is not completed are discharged. The page buffer group 140 senses voltage changes of the bit lines BL1 to BLk, and latches verification result data corresponding to the sensing result.

A detailed construction of the page buffer will be described hereinafter.

The column circuit 150 selects the page buffers PB1 to PBk included in the page buffer group 140 in response to the column address signal CADD output from the control circuit 120. That is, the column circuit 150 sequentially transfers data to be stored in the memory cells to the page buffers PB1 to PBk in response to the column address signal CADD. Further, the column circuit 150 sequentially selects the page buffers PB1 to PBk in response to the column address signal CADD so that data of the memory cells latched in the page buffers PB1 to PBk by the read operation is output to the outside.

The I/O circuit 160 transmits data DATA to the column circuit 150 under the control of the control circuit 120 to output the data DATA input from the outside to the page buffer group 140 to store the data in memory cells in the program operation. When the column circuit 150 transmits the data DATA transferred from the I/O circuit 160 to the page buffers PB1 to PBk of the page buffer group 140 as described above, the page buffers PB1 to PBk store the input data in an inner latch circuit. Further, the I/O circuit 160 outputs data transferred from the page buffers PB1 to PBk of the page buffer group 140 through the column circuit 150 to the outside in the read operation.

The pass/fail check circuit 170 outputs a pass/fail signal P/FS in response to a verification signal output from each of the page buffers PB1 to PBk in the program verification operation performed after the program operation. In detail, a threshold voltage of a memory cell and a target voltage are compared in the program verification operation, and the comparison result is latched in a latch unit of the page buffers PB1 to PBk as verification result data. The latched verification result data is output to the pass/fail check circuit 170 as the verification signal. The pass/fail check circuit 170 outputs the pass/fail signal P/FS indicating whether the program operation is completed to the control circuit 120 in response to the verification signals. The control circuit 120 decides whether there is a memory cell with a threshold voltage lower than a target voltage among the memory cells in which program data is stored in response to the pass/fail signal P/FS, and determines whether to perform the program operation again based on the decision result.

Figure 3:
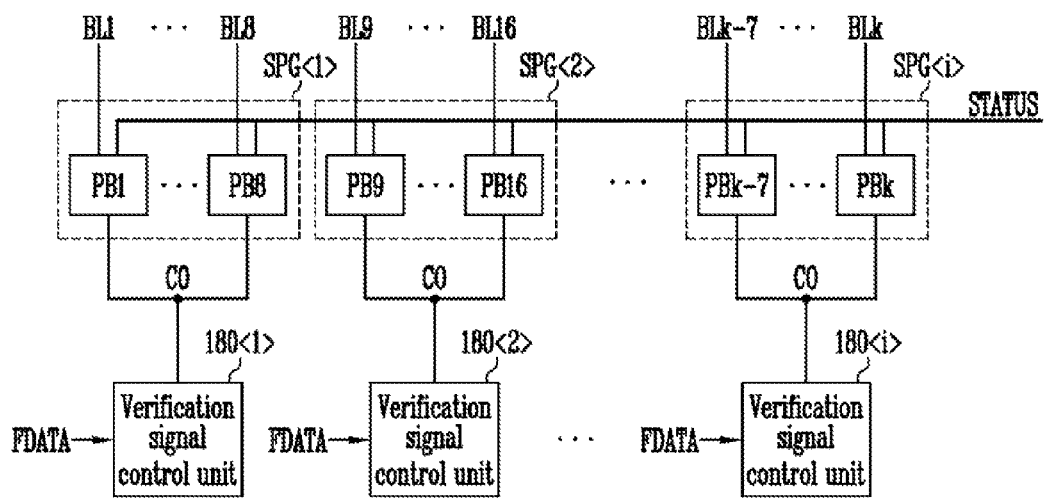
FIG. 3 is a detailed diagram illustrating a page buffer group shown in FIG. 1.

FIG. 3 is a detailed diagram of the page buffer group 140 shown in FIG. 1.

The page buffer group 140 may include a plurality of page buffers PB1 to PBk connected to the memory array 110 through the bit lines BL1 to BLk, and verification signal control units 180<1> to 180<i>.

The page buffers PB1 to PBk perform the program verification operation on memory cells in response to the page buffer control signal PBCON output from the control circuit 120, and output verification signals to a verification terminal STATUS.

A predetermined number of page buffers PB1 to PB8, PB9 to PB 16, . . . , and PBk-7 to PBk constitute sub-page buffer groups SPG<1> to SPG<i>, respectively. The page buffers PB1 to PB8, PB9 to PB 16, . . . , or PBk-7 to PBk in each sub-page buffer group SPG<1> to SPG<i> may be selected by the same column address. Each of the verification signal control units 180<1> to 180<i> are commonly connected to a common node CO together with the page buffers PB1 to PB8, PB9 to PB 16, . . . , or PBk-7 to PBk in each sub-page buffer group SPG<1> to SPG<i>.

The verification signal control units 180<1> to 180<i> control to output the verification signals from the page buffers PB1 to PBk to the verification terminal STATUS based on fail column data FDATA.

Since the verification signal control units 180<1> to 180<i> are arranged by ones in the units of the sub-page buffer groups, for example, in the units of columns, the verification signal control units 180<1> to 180<i> have a stronger tolerance to a physical fail, for example, an operation fail generated due to a very close distance between devices, than the page buffers in the sub-page buffer groups. Accordingly, even when the fail occurs in the page buffers in the verification operation, data reliability may be improved by controlling to output the verification signals by the verification signal control units.

Figure 4:
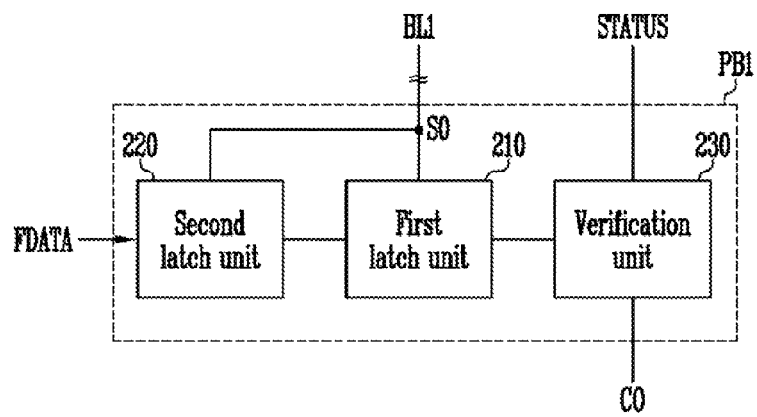
FIG. 4 is a detailed diagram illustrating a page buffer shown in FIG. 3.
Figure 5:
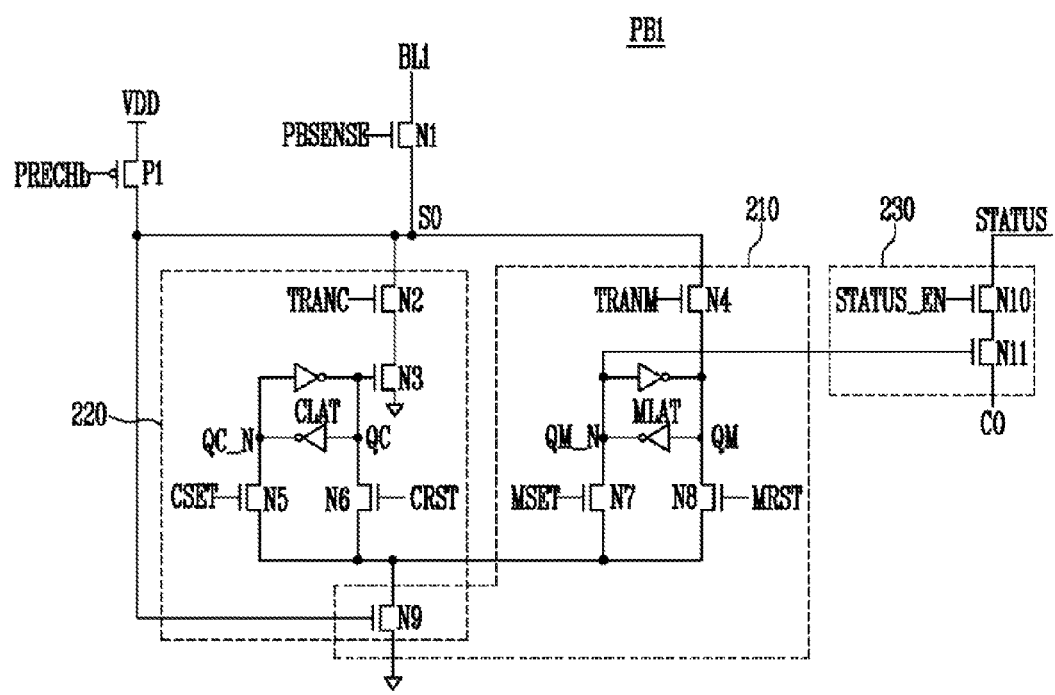
FIG. 5 is a circuit diagram illustrating the page buffer shown in FIG. 4.

FIG. 4 is a detailed diagram of the page buffer PB1 shown in FIG. 3. FIG. 5 is a circuit diagram of the page buffer PB1 shown in FIG. 4.

Referring to FIGS. 4 and 5, the page buffer PB1 operates under the control of the control circuit (120 of FIG. 1), and signals PRECHb, TRANC, TRANM, CRST, CSET, MRST, MSET, PBSENSE, and STATUS_EN described hereinafter may be output from the control circuit.

The page buffer PB1 may include a bit line connection circuit N1, a precharge circuit P1, a first latch unit 210, a second latch unit 220, and a verification unit 230.

The bit line connection circuit N1 performs an operation of connecting the bit line BL1 and one of the latch units in response to the connection signal PBSENSE. The latch units are connected to the bit line connection circuit N1 in parallel, and a connection node between the bit line connection circuit N1 and the latch units may be a sensing node SO.

The precharge circuit P1 performs an operation of precharging the sensing node SO in response to the precharge signal PRECHb.

The number of latches may be changed depending on a design. The page buffer PB1 including two latches is illustrated in FIG. 4, and will be explained as an example.

The first latch unit 210 may apply a program prohibition voltage or program permission voltage (e.g., 0 V) to the bit line BL1 based on data for programming in the memory cell in the program operation. The first latch unit 210 stores the verification result data by changing, for example, to data 1, or maintaining initially stored data, for example, data 0, depending on whether a threshold voltage of the memory cell is more than a target verification voltage or less than the target verification voltage in the program verification operation performed after the program operation.

The first latch unit 210 may include a first latch MLAT and switching elements N4, N7, N8, and N9. The first latch MLAT latches data for programming in the memory cell and the verification result data. The switching element N4 connects a first node QM of the first latch MLAT to the sensing node SO in response to the transmission signal TRANM. The switching element N7 is connected to a second node QM_N of the first latch MLAT and controlled by the set signal MSET. The switching element N8 is connected to the first node QM of the first latch MLAT and controlled by the reset signal MRST. The switching element N9 is connected between the switching elements N7 and N8 and a ground terminal and controlled by a voltage level of the sensing node SO.

The second latch unit 220 controls to generate the verification result data based on the fall column data FDATA.

The second latch unit 220 may include a second latch CLAT and switching elements N2, N3, N5, N6, and N9. The second latch CLAT latches the fail column data FDATA. The switching element N2 is connected to the sensing node SO and controlled by the transmission signal TRANC. The switching element N3 is connected between the switching element N2 and the ground terminal and controlled by the fail column data FDATA. The switching element N5 is connected to a second node QC_N of the second latch CLAT and controlled by the set signal CSET. The switching element N6 is connected to a first node QC of the second latch CLAT and controlled by the reset signal CRST. The switching element N9 is connected between the switching elements N5 and N6 and the ground terminal and controlled by a voltage level of the sensing node SO. That is, the switching element N9 is commonly used for both latch units 210 and 220.

The verification unit 230 generates the verification signal based on the verification result data, and outputs the generated verification signal to the verification terminal STATUS.

The verification unit 230 may include switching elements N10 and N11 connected in series between the verification terminal STATUS and the common node CO. Here, the switching element N10 is controlled by the verification enable signal STATUS_EN, and the switching element N11 is controlled by a voltage level of the second node QM_N of the first latch MLAT.

When storing first data (e.g., 0) in the memory cell, the first node QM of the first latch unit 210 becomes a logic level low, and when storing second data (e.g., 1), the first node QM of the first latch unit 210 becomes a logic level high.

After performing the program and program verification operations, when a threshold voltage of a memory cell storing the first data ("0") is more than the verification voltage (target voltage), the sensing node SO becomes a logic level high to turn on the switching element N9, the switching element N7 is turned on in response to the set signal MSET, and the second node QM_N of the first latch unit 210 is changed from a logic level high to a logic level low.

Even when the verification enable signal STATUS_EN is input, since the second node QM_N of the first latch unit 210 is a logic level low, the switching element N11 of the verification unit 230 is not turned on, and thus the verification signal is not output to the verification terminal STATUS. Although described hereinafter, the verification terminal STATUS is in a precharge state. Accordingly, when threshold voltages of all memory cells of a page are increased more than the verification voltage, the verification terminal STATUS is maintained at a logic level high. In such case, it is determined that the program verification operation is passed.

When there is at least one memory cell with a threshold voltage less than the verification voltage among memory cells in a page, the sensing node SO becomes a logic level low and the switching element N9 is not turned on, after the verification operation. Accordingly, the second node QM_N of the first latch unit 210 is maintained at a logic level high.

When the verification enable signal STATUS_EN is input, since the switching elements N10 and N11 are turned on, the common node CO and the verification terminal STSTUS are connected. In a conventional art, since the common node CO and the ground terminal are connected, the verification terminal STATUS is discharged. In such case, it is determined that the program verification operation is failed.

The second latch unit 220 temporarily stores the fail column data FDATA. When a memory cell performing the program verification operation is included in a fail column, the first node QC of the second latch unit 220 is a logic level high. When the transmission signal TRANC is input, the switching elements N2 and N3 are turned on and the sensing node SO is discharged. Since the switching element N9 is not turned on, the second node QM_N of the first latch unit 210 is maintained at a logic level high.

When there is the fail column, the fail column may be replaced with a redundancy column. Through the above-described operation, when there is the fail column, the fail column has no effect on all verification results of a page. It is referred to as a fail column masking operation.

A space between memory cells becomes narrower as a degree of integration is increased. Thus, sizes of devices included in the page buffer become small. As a result, a physical fail may occur in the internal latches of the page buffer in the verification operation. The fail column masking operation may be impeded by the fail occurred in the internal latches of the page buffer. It may be a concern because the verification operation on the memory cells included in the fail column has an effect on all verification results of a page.

In order to resolve such concerns, the semiconductor device includes a verification signal control unit.

Figure 6:
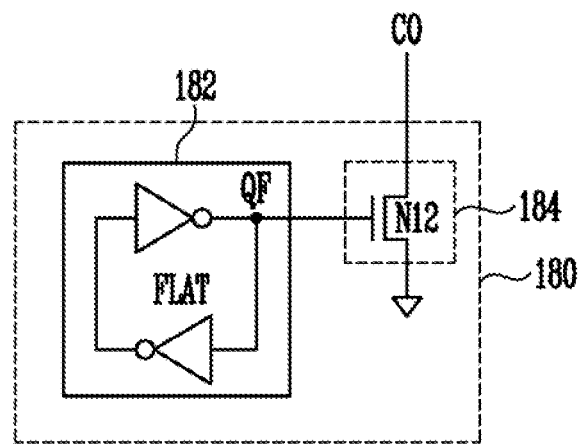
FIG. 6 is a detailed diagram illustrating a verification signal control unit shown in FIG. 3.

FIG. 6 is a detailed diagram Illustrating the verification signal control unit 180 shown in FIG. 3.

Referring to FIG. 6, the verification signal control unit 180 may include a third latch unit 182 and a voltage control unit 184.

The third latch unit 182 may include a third latch FLAT for latching the fail column data FDATA.

The voltage control unit 184 controls to connect the common node CO and the ground terminal based on the fail column data FDATA. The voltage control unit 184 may include a switching element N12 for controlling to connect the common node CO and the ground terminal based on a voltage level of a first node QF of the third latch FLAT.

The third latch unit 182 temporarily stores the fail column data FDATA. When a memory cell performing the program verification operation is included in a fail column, the first node QF of the third latch unit 182 becomes a logic level low. Since the switching element N12 is not turned on, the common node CO is not discharged.

As described above, since the verification signal control unit 180 is arranged in each of the sub-page buffer groups, the third latch FLAT included in the verification signal control unit 180 has a stronger tolerance to a physical fail than the second latch CLAT included in the page buffer. Accordingly, even when the page buffer is prevented from properly performing the fail column masking operation since a fail occurs in the second latch CLAT of the page buffer in the verification operation, the verification operation of the memory cell included in the fail column has no effect on all the verification results of the page by performing the fail column masking operation and controlling to output the verification signal in the verification signal control unit 180. Accordingly, data reliability may be improved.

Figure 7:
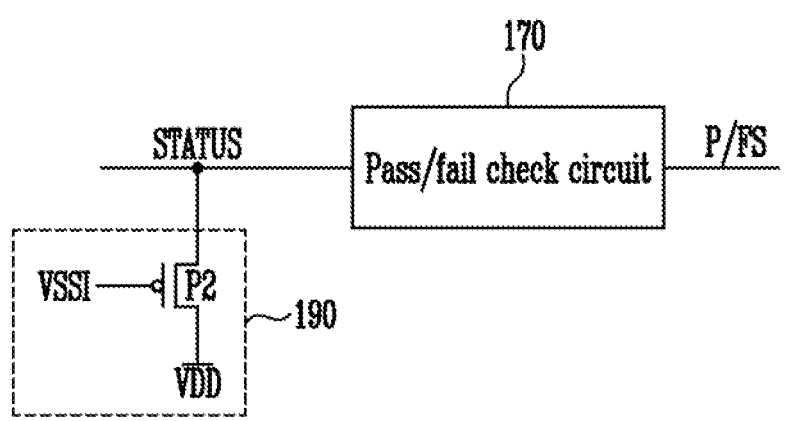
FIG. 7 is a diagram for explaining a verification terminal precharge unit.

FIG. 7 is a diagram for explaining a verification terminal precharge unit.

Referring to FIG. 7, the page buffer group 140 may further include a verification terminal precharge unit 190 that may connect to the verification terminal STATUS and precharge the verification terminal STATUS in response to a verification terminal precharge signal VSSI.

The verification terminal precharge unit 190 may include a switching element P2 that is connected between a power supply terminal VDD and the verification terminal STATUS and controlled by the verification terminal precharge signal VSSI.

The pass/fail check circuit 170 connects to the verification terminal STATUS, and generates a verification pass/fail signal P/FS based on a voltage level of the verification terminal STATUS.

Figure 8:
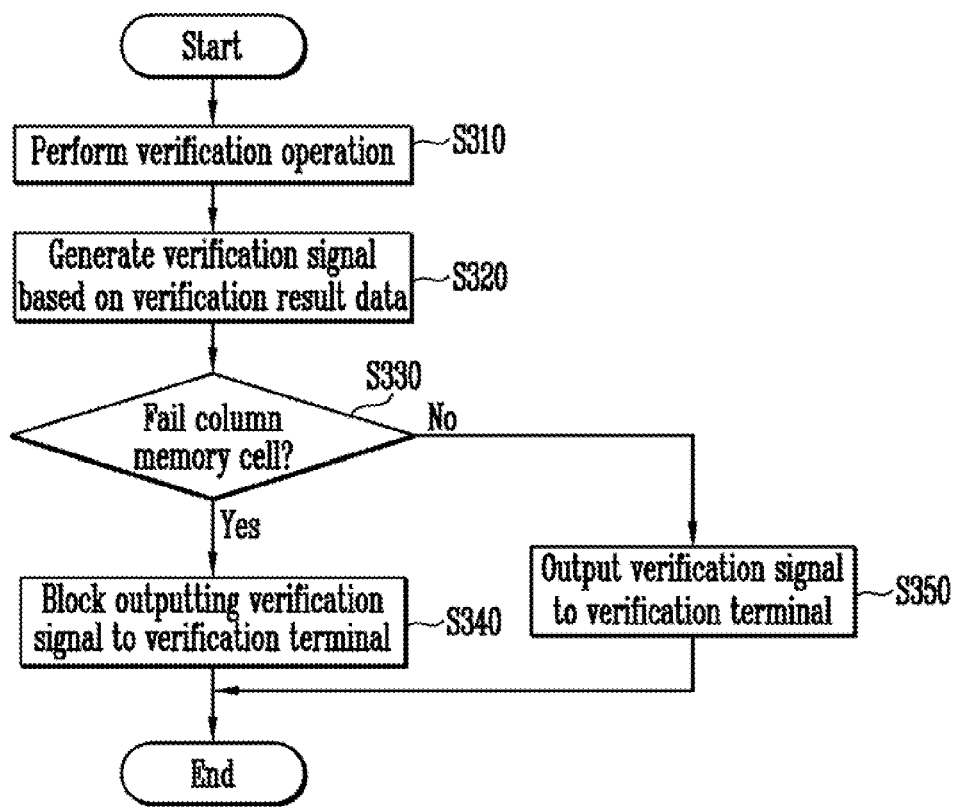
FIGS. 8 and 9 are flowcharts for describing a method of operating a semiconductor device according to an exemplary embodiment of the present invention.
Figure 9:
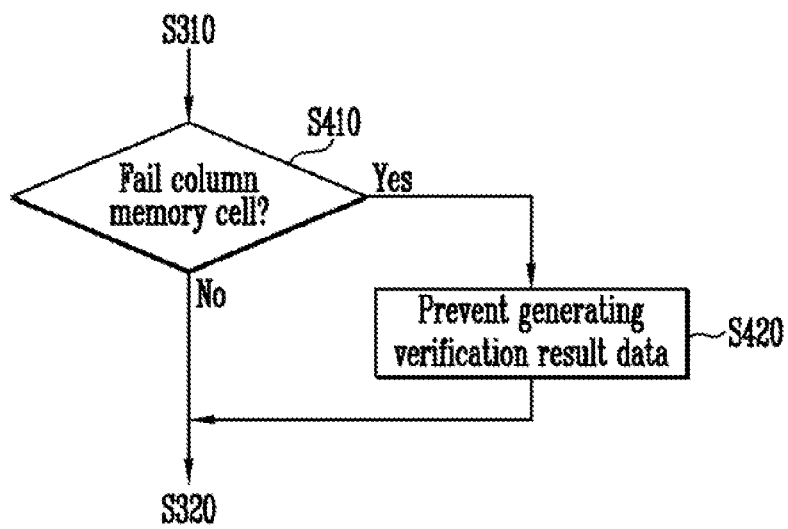

FIGS. 8 and 9 are flowcharts for describing a method of operating a semiconductor device according to an embodiment of the present invention.

Referring to FIG. 8, a method of operating a semiconductor device includes performing a verification operation on memory cell (S310). The verification operation may include program verification and erase verification operations.

Next, the method includes generating a verification signal for outputting to a verification terminal based on verification result data generated by the performing of the verification operation (S320).

The method includes confirming whether the memory cell is included in a fail column (S330), and blocking (or preventing) outputting the verification signal to the verification terminal when the memory cell is included in the fail column (S340).

The method includes outputting the verification signal to the verification terminal when the memory cell is not included in the fail column (S350). When the verification signal is output to the verification terminal, it is determined that the verification operation is failed.

Accordingly, in the verification operation of the memory cell included in the fail column, the verification operation of the memory cell included in the fail column has no effect on all the verification results of the page by blocking outputting the verification signal. Accordingly, data reliability may be improved.

Referring to FIG. 9, the method includes confirming whether the memory cell is included in the fail column (S410), after performing the verification operation on the memory cell (S310). The method includes blocking (or preventing) generating the verification result data when the memory cell is included in the fail column (S420).

Figure 10:
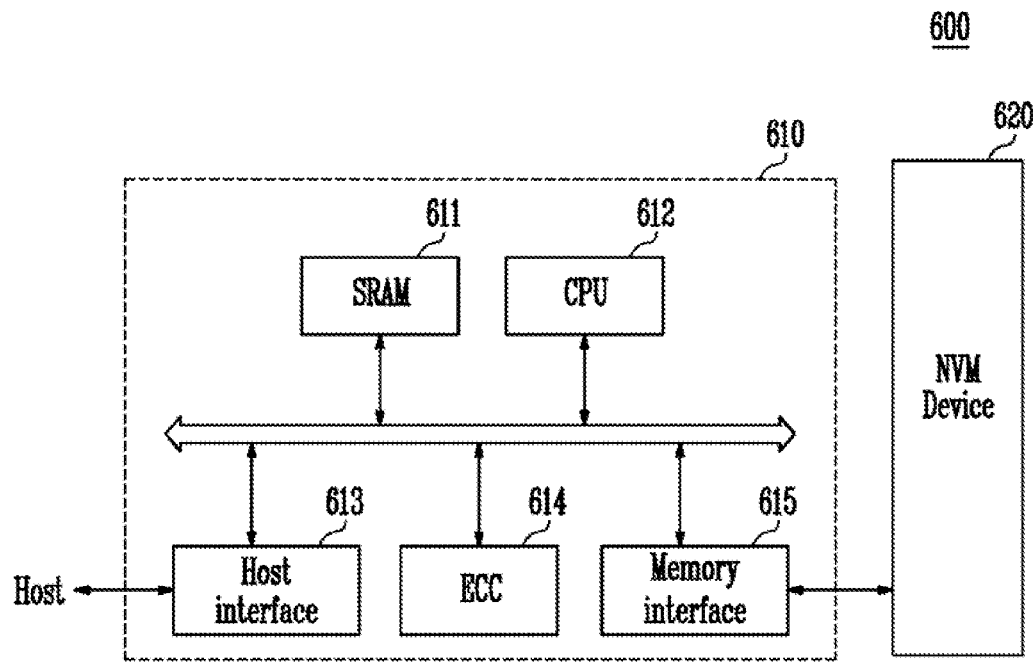
FIG. 10 is a block diagram illustrating a memory system according to an exemplary embodiment of the present invention.

FIG. 10 is a block diagram illustrating a memory system 600 according to an embodiment of the present invention.

Referring to FIG. 10, the memory system 600 may include a non-volatile memory (NVM) device 620, and a memory controller 610.

The NVM device 620 has the same construction and operation as the semiconductor memory device described above for compatibility with the memory controller 610. The memory controller 610 may control the NVM device 620. The NVM device 620 and the memory controller 610 may be integrated as one semiconductor device and provided as a memory card or a solid-state drive (SSD). A SRAM 611 is used as an operating memory of a central processing unit (CPU) 612. A host interface (I/F) 613 includes a protocol for data exchange between a host and the memory system 600. An error checking and correcting (ECC) circuit 614 detects and corrects an error included in data read out from the NVM device 620. A memory interface 615 interfaces with the NVM device 620. The CPU 612 performs overall control operations for data exchange of the memory controller 610.

Although not shown, it may be obvious to those of ordinary skill in the art that the memory system 600 further includes a ROM or the like (not shown) for storing code data for an interface with the host. The NVM device 620 may be a multichip package configured as a plurality of flash memory chips. The memory system 600 may lower an error generation probability and be provided as a storage medium with high reliability. Especially, the NVM device 620 of the present invention may be included in a memory system such as an SSD. Here, the memory controller 610 may communicate with the outside, for example, the host, through at least one among various interface protocols, such as a universal serial bus (USB), a multi-media card (MMC), a peripheral component interconnect (PCI), a peripheral component interconnect-express (PCI-E), a serial advanced technology attachment (SATA), a parallel advanced technology attachment (PATA), a small computer system interface (SCSI), an enhanced small device interface (ESDI), an integrated drive electronics (IDE).

Figure 11:
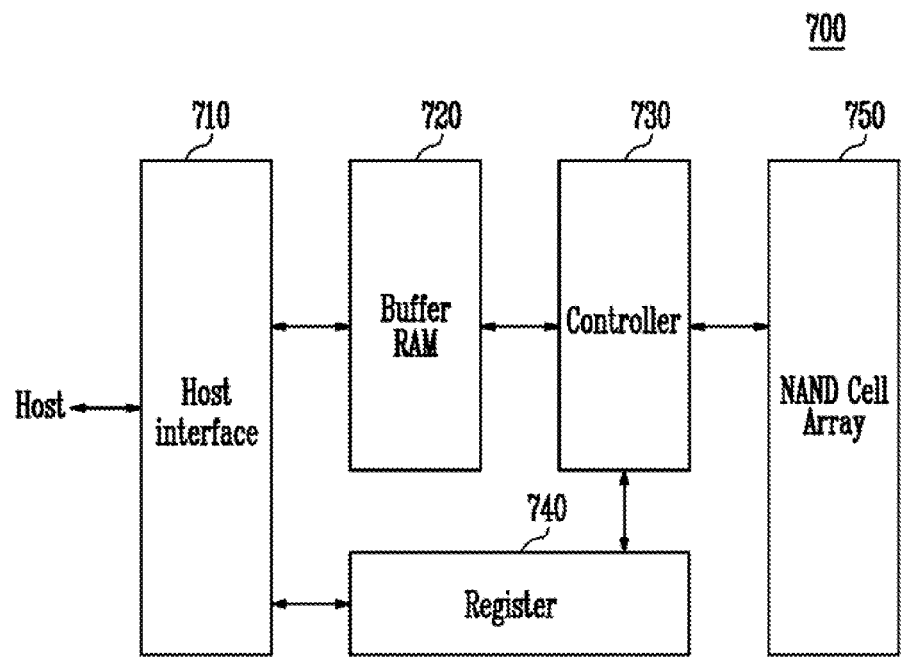
FIG. 11 is a block diagram illustrating a fusion memory device or a fusion memory system performing an operation according to various exemplary embodiments of the present invention.

FIG. 11 is a block diagram illustrating a fusion memory device or a fusion memory system for performing an operation according to various embodiments of the present invention. For example, technical features of the present invention may be applied to a OneNAND flash memory device 700 as a fusion memory device.

The one NAND flash memory device 700 may include a host interface 710 for exchanging various information with an apparatus using a different protocol, a buffer RAM 720 for embedding codes to drive a memory device and temporarily storing data, a controller 730 for controlling a read operation, a program operation, and every status in response to a control signal and a command, which are input from the outside, a register 740 for storing data such as a command, an address, a configuration for defining system operational environments of the inside of the memory device, and a NAND flash cell array 750 configured by an operational circuit including a non-volatile memory cell and a page buffer. The OneNAND flash memory device may be programmed as described above in response to a write request from the host.

Figure 12:
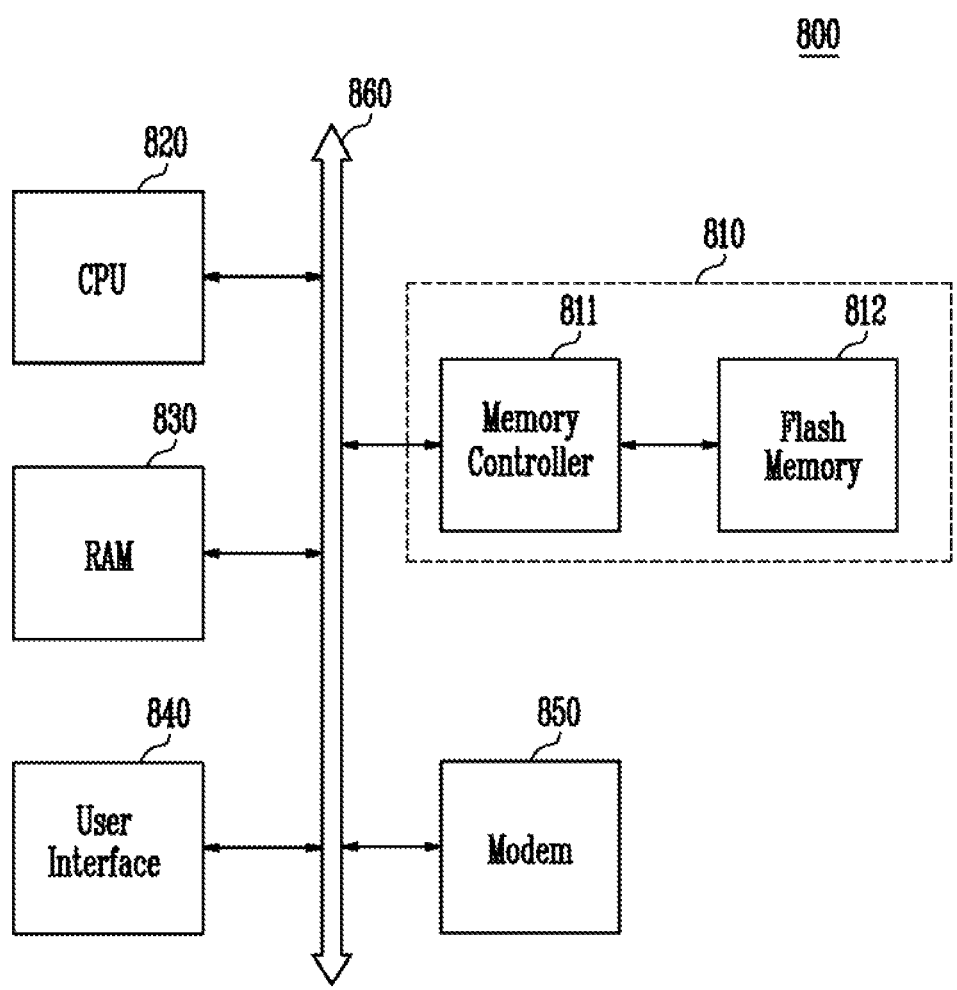
FIG. 12 is a block diagram illustrating a computing system Including a flash memory device according to an exemplary embodiment of the present invention.

FIG. 12 is a s block diagram illustrating a computing system 800 including a flash memory device according to an embodiment of the present invention.

The computing system 800 may include a CPU 820, a RAM 830, a user interface 840, a modem 850 such as a baseband chipset, and a memory system 810 including a memory controller 811 and a flash memory 812, which are electrically connected to a system bus 860. If the computing system 800 is a mobile apparatus, the computing system 800 may further include a battery (not shown) for providing an operational voltage of the computing system 800. Although not shown, it may be obvious to those of ordinary skill in the art that the computing system 800 may further include an application chipset, a camera image processor (CIP), a mobile DRAM, or the like. For example, the memory system 810 may be configured by an SSD using an NVM device for storing data. Alternatively, the memory system 810 may be provided as a fusion flash memory, for example, a OneNAND flash memory.

The embodiments of the present invention described above are implemented by not only an apparatus or method, but also a program executing functions corresponding to the configuration of the embodiments of the present invention or a recording medium in which the program is recorded. The embodiments of the present invention may be easily implemented by those of ordinary skill in the art.

The semiconductor device and the method of operating the same perform a fail column masking operation by including a latch outside the page buffer with a stronger tolerance to a physical fail than latches inside the page buffer. Even when a fail occurs in latches inside the page buffer and the page buffer cannot properly perform the fail column masking operation in the verification operation, the fail column masking operation may be performed outside the page buffer. Accordingly, data reliability may be improved.

In the drawings and specification, there have been disclosed typical exemplary embodiments of the invention, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A semiconductor device, comprising:
a plurality of page buffers coupled to bit lines and suitable for performing a verification operation to output a verification signal to a verification terminal, wherein a predetermined number of page buffers are grouped into a sub-page buffer group; and
verification signal control units, wherein each of the verification signal control units is coupled to the page buffers included in the corresponding sub-page buffer group and suitable for controlling to output the verification signals from the page buffers included in the corresponding sub-page buffer group to a verification terminal based on fail column data.

2. The semiconductor device of claim 1, wherein each of the page buffers comprises:
a first latch unit suitable for generating verification result data obtained by the verification operation; and
a verification unit suitable for generating the verification signal based on the verification result data.

3. The semiconductor device of claim 2, wherein each of the page buffers further comprises a second latch unit suitable for controlling the generation of the verification result data based on the fail column data.

4. The semiconductor device of claim 3, wherein each of the verification signal control units comprises:
a third latch unit suitable for latching the fail column data; and
a voltage control unit coupled to the verification unit, and suitable for controlling to allow a voltage to be input to the verification unit based on the fail column data.

5. The semiconductor device of claim 1, wherein the page buffers included in the respective sub-page buffer group are selected by the same column address.

6. The semiconductor device of claim 1, further comprising a pass/fail check circuit coupled to the verification terminal and suitable for generating a verification pass/fail signal based on the verification signal.

7. The semiconductor device of claim 1, further comprising a verification terminal precharge unit coupled to the verification terminal and suitable for precharging the verification terminal in response to a verification terminal precharge signal.

8. A method of operating a semiconductor device, comprising:
performing a verification operation on a memory cell; and
outputting a verification signal to a verification terminal based on verification result data generated in the performing of the verification operation,
wherein the verification signal is prevented from being output to the verification terminal when the memory cell is included in a fail column.

9. The method of claim 8, further comprising, blocking the generation of the verification result data after the performing of the verification operation when the memory cell is included in the fail column.

10. The method of claim 8, wherein, when the verification signal is output to the verification terminal, it is determined that the verification operation is failed.

11. A semiconductor device, comprising:
a memory array including a plurality of row lines and a plurality of column lines;
a plurality of page buffers coupled to the respective column lines and suitable for performing a verification operation to output a verification signal to a verification terminal, wherein each of the page buffers includes a first latch unit for generating verification result data obtained by the verification operation, a second latch unit for controlling the generation of the verification result data based on fail column data, and a verification unit for generating the verification signal based on the verification result data;
a verification signal control unit coupled to the predetermined number of page buffers and suitable for controlling the verification signal output from the predetermined number of page buffers to a verification terminal based on the fail column data, wherein the verification signal control unit includes a third latch unit suitable for latching the fail column data, and a voltage control unit coupled to the verification unit and suitable for controlling to allow a voltage to be input to the verification unit based on the fail column data; and
a pass/fail check circuit coupled to the verification terminal and suitable for generating a verification pass/fail signal based on the verification signal.

12. The semiconductor device of claim 11, further comprising a verification terminal precharge unit coupled to the verification terminal and suitable for precharging the verification terminal in response to a verification terminal precharge signal.

* * * * *